United States Patent [19]

Mataki et al.

[11] Patent Number: 5,471,494
[45] Date of Patent: Nov. 28, 1995

[54] METHOD FOR SELECTING A SELF PULSATING SEMICONDUCTOR LASER

[75] Inventors: Hiroshi Mataki; Satoshi Uchida; Hajime Sakiyama, all of Kyoto, Japan

[73] Assignee: Rohm Co., Ltd., Kyoto, Japan

[21] Appl. No.: 254,079

[22] Filed: Jun. 6, 1994

Related U.S. Application Data

[63] Continuation-in-part of Ser. No. 36,727, Mar. 25, 1993, abandoned.

[30] Foreign Application Priority Data

Apr. 8, 1992 [JP] Japan ..................... 4-87152
Apr. 15, 1992 [JP] Japan ..................... 4-95452

[51] Int. Cl.⁶ ........................... H01S 3/18
[52] U.S. Cl. ................ 372/43; 372/44; 372/25; 372/30
[58] Field of Search ............... 372/43, 25, 30, 372/44

[56] References Cited

U.S. PATENT DOCUMENTS

5,212,704  5/1993  Chen et al. ..
5,235,609  8/1993  Uchida et al. ..

Primary Examiner—Rodney B. Bovernick
Assistant Examiner—Robert McNutt
Attorney, Agent, or Firm—Nikaido, Marmelstein, Murray & Oram

[57] ABSTRACT

A method for selecting a semiconductor laser is provided which contributes to improved productivity of a highly reliable semiconductor laser of prolonged lifetime, and which includes the steps of: (a) measuring highest peak intensity, Ia, and next highest peak intensity, Ib, of an interference fringes pattern of laser radiation of each semiconductor laser using an interferometer to find a damping ratio of visibility of the interference fringes pattern, $\gamma=Ib/Ia$; and (b) selecting a semiconductor exhibiting self-pulsation by selecting a semiconductor laser which emits laser radiation whose damping ratio of visibility, $\gamma$, is 0.5 or less.

6 Claims, 9 Drawing Sheets

METHOD FOR SELECTING A SELF PULSATING SEMICONDUCTOR LASER

CROSS-REFERENCE TO RELATES APPLICATION

This is a continuation-in-part of application Ser. No. 08/036,727 filed on Mar. 25, 1993, now abandoned.

BACKGROUND OF THE INVENTION

The present invention relates to a method for selecting a semiconductor laser and, more particularly, to a method for selecting a self-pulsation type semiconductor laser which is utilized as a basic device in optoelectronics and suitably applied in particular to the fields of optical recording, optical communications and the like. The present invention plays an important role in obtaining a semiconductor laser having excellent reliability which can be manufactured with improved productivity.

In various technical fields utilizing semiconductor lasers, there have often arisen problems of noise caused by the coherence which laser radiation generated by such semiconductor lasers has. In the field of optical communications in particular, there exists a problem of noise (modal noise) produced by constructive and destructive interference among modes at the output end of an optical fiber when laser radiation generated by a semiconductor laser is made to propagate through a multimode optical fiber (refer, for example, to Publication of Japanese Electronics and Data Communications Society, Jan. 1989, pp. 60, "Application of Laser Diode for Public Use to Optical Communications" by Yoneda and Shudoh).

As a means for avoiding such a problem, it has been attempted, by using a semiconductor laser that exhibits a high frequency self-pulsation even under a continuous steady state operation, to eliminate the interference among modes.

There have hitherto been known such a self-pulsation semiconductor lasers of: the type (i) wherein a saturable absorbing layer is formed in a cladding layer (as disclosed in, for example, Japanese Unexamined Patent Publications Nos. 171186/1986 and 202083/1988); the type (ii) wherein the width of a stripe and the thickness of a cladding layer are optimized (as disclosed in, for example, Japanese Unexamined Patent Publication No. 101089/1986); the type (iii) wherein an active layer is of a quantum well structure (as disclosed in, for example, Japanese Unexamined Patent Publications Nos. 72688/1990 and 78290/1990); the type (iv) wherein electrodes for current injection are separated from each other (as disclosed in, for example, Japanese Unexamined Patent Publication No. 5680/1987); and the type (v) wherein each laser employs an original structure for suppressing carrier diffusion in the lateral direction in terms of cross section (as disclosed in, for example, Japanese Unexamined Patent Publications Nos. 133789/1987, 97389/1987, 97385/1987 and 86783/1987).

Nevertheless, semiconductor lasers of the type (i) involved a problem of poor reliability due to generation of heat in the saturable absorbing layer. With the type (ii), the width of a stripe and the thickness of a cladding layer needed to be precisely controlled, thereby cause a problem of low productivity. As far as the type (iii) of the semiconductor lasers were of the structure having a stripe of a single width, the width or number of wells needed to be precisely controlled for forming a quantum well structure capable of generating favorable self-pulsation, and further the rate of crystal growth needed to be made low for formation of a good quantum well, thereby cause a problem of low productivity as with the type (ii). Since the type (iv) of the semiconductor lasers were of a separated electrode structure, there was to add another microfabrication step, i.e. second resist process in the production process, thereby cause a problem of low productivity. Further, with various semiconductor lasers proposed as the type (v), they were each of a complicated structure which required a complicated production process, thus lowering the productivity thereof.

Further, all the semiconductor lasers thus fabricated did not necessarily exhibit self-pulsation and, hence, lasers not exhibiting self-pulsation could be present among products, depending upon the production process. In selecting semiconductor lasers exhibiting self-pulsation by distinguishing from those not exhibiting self-pulsation, the pulsation waveform of each laser was displayed by oscilloscope or the like so as to be visually judged whether the laser exhibits self-pulsation or not. Since the visual judgment was difficult and could not be automated, semiconductor lasers were produced with decreased productivity and reliability.

SUMMARY OF THE INVENTION

To overcome the aforesaid problems attributable to the prior art, or the problems of low reliability and of low productivity, and to obtain inexpensive, self-pulsation semiconductor laser which will not develop interference when used in the combination with a multimode optical fiber in optical communications, there are experimentally manufactured semiconductor lasers of various structures to examine the self-pulsation state of each laser and have, as a result, attained the present invention.

Thus, according to the present invention there is provided a method for selecting a semiconductor laser, including the steps of: (a) measuring highest peak intensity, Ia, and next highest peak intensity, Ib, of an interference fringes pattern of laser radiation of each semiconductor laser using an interferometer to find a damping ratio of visibility of the interference fringes pattern, $\gamma=Ib/Ia$; and (b) selecting a semiconductor laser exhibiting self-pulsation by selecting a semiconductor laser which emits laser radiation whose damping ratio of visibility, $\gamma$, is 0.5 or less.

Preferably, the method of the invention is applied to a semiconductor laser including an active layer having an active region of a striped structure and cladding layers sandwiching the active layer, the active region being formed with a stripe having at least two different widths. This is because such a semiconductor laser is possible to exhibit self-pulsation and to be easily manufactured using a simplified production process.

It is known that the coherency of laser radiation is represented in terms of attenuation of "visibility V" determined by the following equation (refer to, for example, Koichi Shimoda "Introduction to Laser Physics", 1983, Iwanami Shoten, pp. 27).

$$V=(Imax-Imin)/(Imax+Imin)$$

where Imax and Imin are, respectively, light intensities at a maximum and minimum of an interference pattern of emitted laser radiation. Such light intensities are measured with an interferometer, for example, a Michelson interferometer and a Mach-Zehnder interferometer. Such an interference pattern is produced by separating the emitted laser radiation into two beams, varying the optical-path difference between the two beams, and recombining them into one beam with use of the interferometer.

Figure 7:
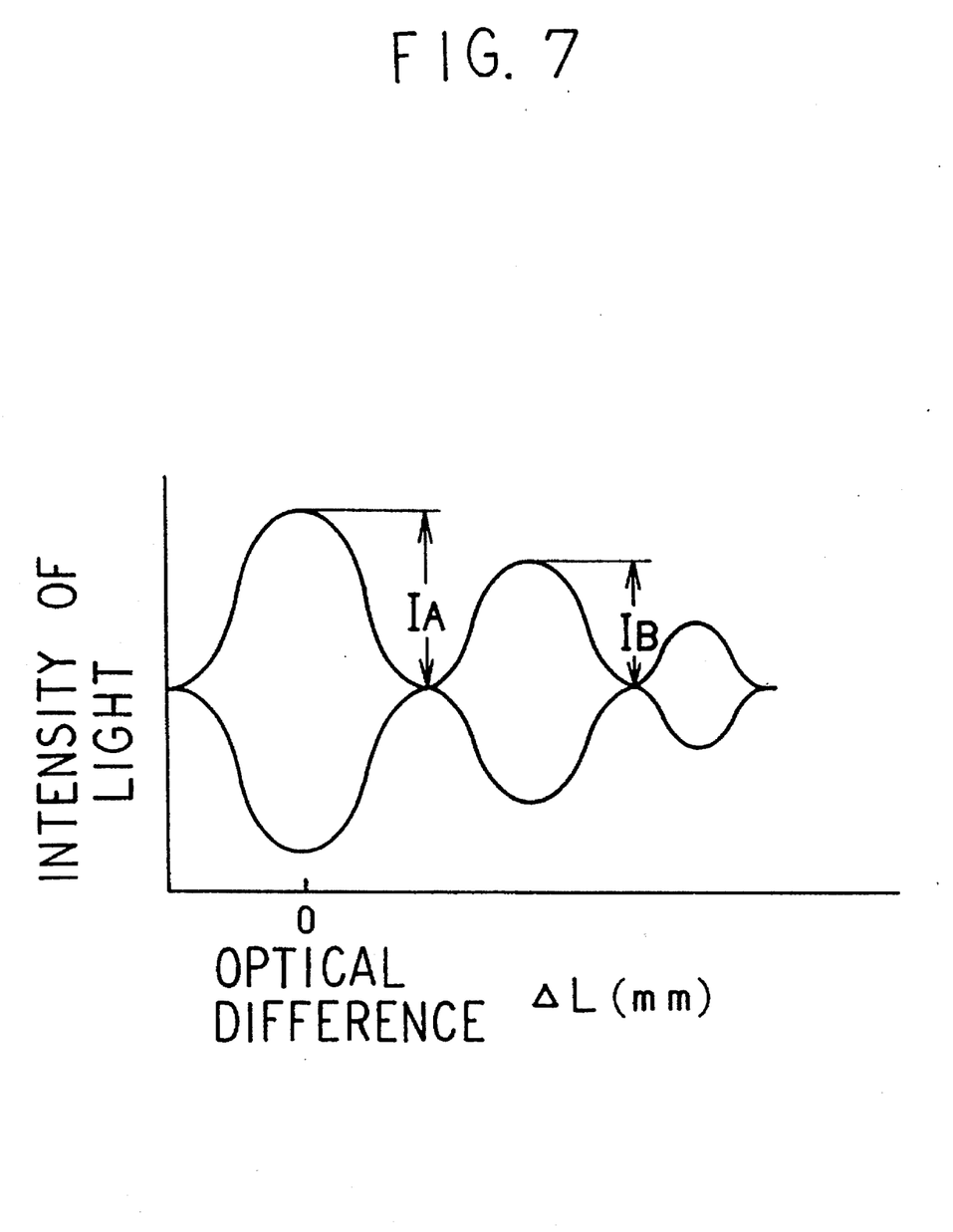
FIG. 7 is a graphic representation of the envelope of an interference fringes pattern of laser radiation for illustrating the damping ratio of visibility of the interference fringes pattern.

In the envelope of the interference pattern, when a peak intensity thereof represents Ia on condition that the optical-path difference between the two beams of laser radiation is 0, and adjacent peak intensity thereof which appears next represents Ib (refer to FIG. 7), the ratio γ of the two peak intensities, i.e. γ=Ib/Ia generally represents the damping ratio of visibility. The coherency of laser radiation can easily be found in terms of value γ by measuring these peak intensities Ia and Ib with an measuring instrument using an interference such as a optical spectrum analyzer and a wavemeter, which instrument is generally available on market.

There has been found that a semiconductor laser whose γ value is 0.5 or less generates self-pulsation while one whose γ value exceeds 0.5 does not generate permanently continuing periodic pulsation though possibly causes relaxation osillation. Further, there has been found that a semiconductor laser of the structure wherein stripes having at least two different widths are connected to one another in the direction of reasonance of laser radiation offers high productivity and is likely to have a γ value of 0.5 or less.

To obtain the structure wherein a stripe having at least two different widths is connected in the direction of resonance of laser radiation, fabrication of an additional photomask depicting the stripe is only needed. Therefore, there is no need to provide a complicated production process for a semiconductor laser, to increase the number of production steps, or to conduct precise fabrication control. On the other side, to select a semiconductor laser whose γ value assumes 0.5 or less, it is only needed to install a commercially available measuring instrument using interference in the production line and to perform automatic measurement using the same without conducting a difficult judgement on a wavefrom appearing on an oscilloscope. This will never be a factor of lowering the productivity while enabling an objective judgment assuredly and easily. In addition, the structure wherein a stripe having at least two different widths is connected in the direction of resonance of laser radiation is not a heat-absorptive structure and, hence, will not arise a problem of low reliability due to heat absorption by a saturable absorbing layer included in the aforesaid conventional semiconductor laser.

If a semiconductor laser of the type having at least one quantum well in an active layer thereof is provided with a stride having at least two different widths, the productivity of such a semiconductor laser would be improved. As mentioned above, with the conventional structure having a stripe of a single width, the width or number of wells needed to be precisely controlled for generation of self-pulsation and, in addition, the rate of crystal growth needed to be lowered for formation of good wells. This was responsible to the problem of low productivity. In contrast, by employing the structure wherein stripes having at least two different widths are connected to one another in the direction of resonance of laser radiation, there is no more needed to precisely form a quantum well as in the prior art and, hence, a semiconductor laser having a quantum well and exhibiting self-pulsation can readily be obtained without lowering the productivity.

By virtue of a quantum well layer, the differential mode gain of laser pulsation can be increased and, hence, high-frequency self-pulsation can be realised by virtue of a synergic effect of the striped structure and the quantum well structure.

With regard to the geometric shape of the structure wherein stripes having two different widths are connected to one another in the direction of resonance of laser radiation, it is preferable for making the γ value assume 0.5 or less that the ratio of the smallest width b to the largest width a of the stripe having at least two different widths satisfies b/a<0.87.

Further, it is preferable that the ratio of the length d of a portion having the largest width to the length c of a portion having the smallest width ranges from 0.7 to 1.3. Such a ratio in this range allows to easily generate self-pulsation without degrading the temperature characteristics of the laser.

Further still, it is preferable for easy generation of self-pulsation that the number of portions of which the width is smaller than that of the rest is 2 to 5 for each chip.

DETAILED DESCRIPTION

Hereinafter, the present invention will be described in detail with reference to the attached drawings.

Figure 1:
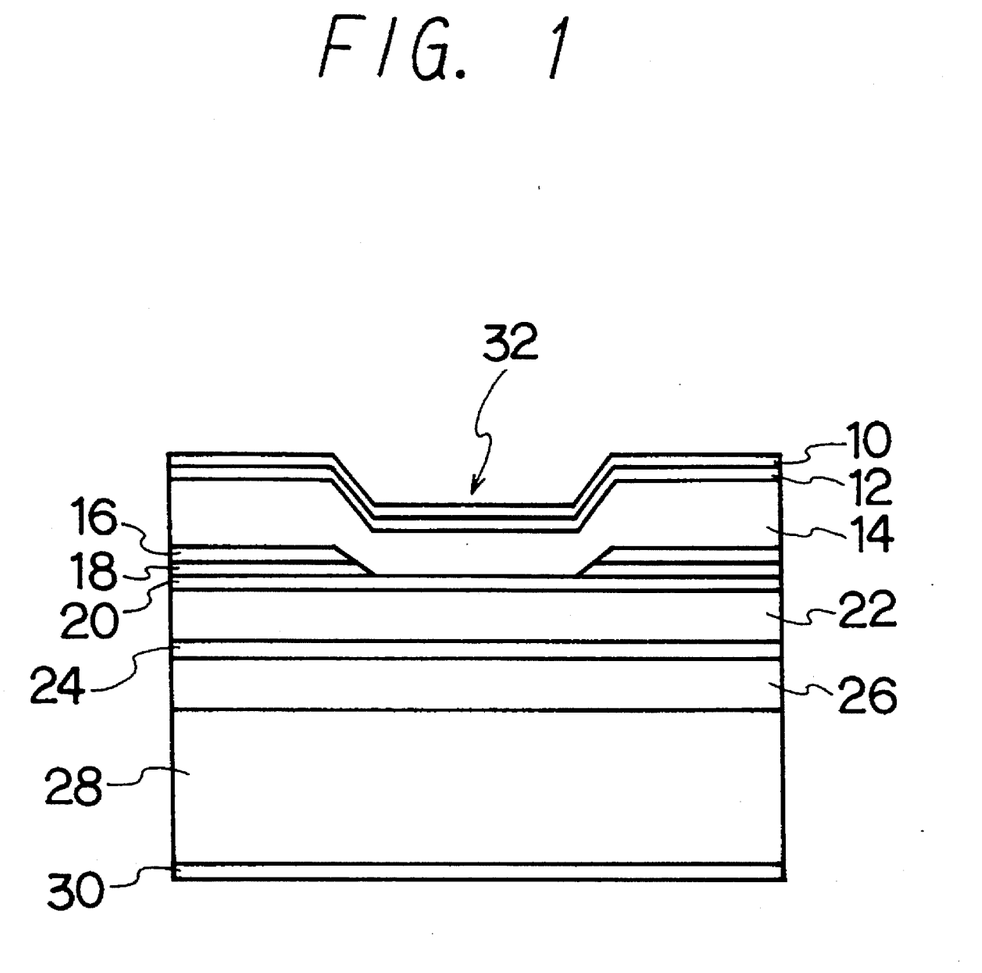
FIG. 1 is a schematic sectional view showing a semiconductor laser as an embodiment of the present invention.
Figure 2:
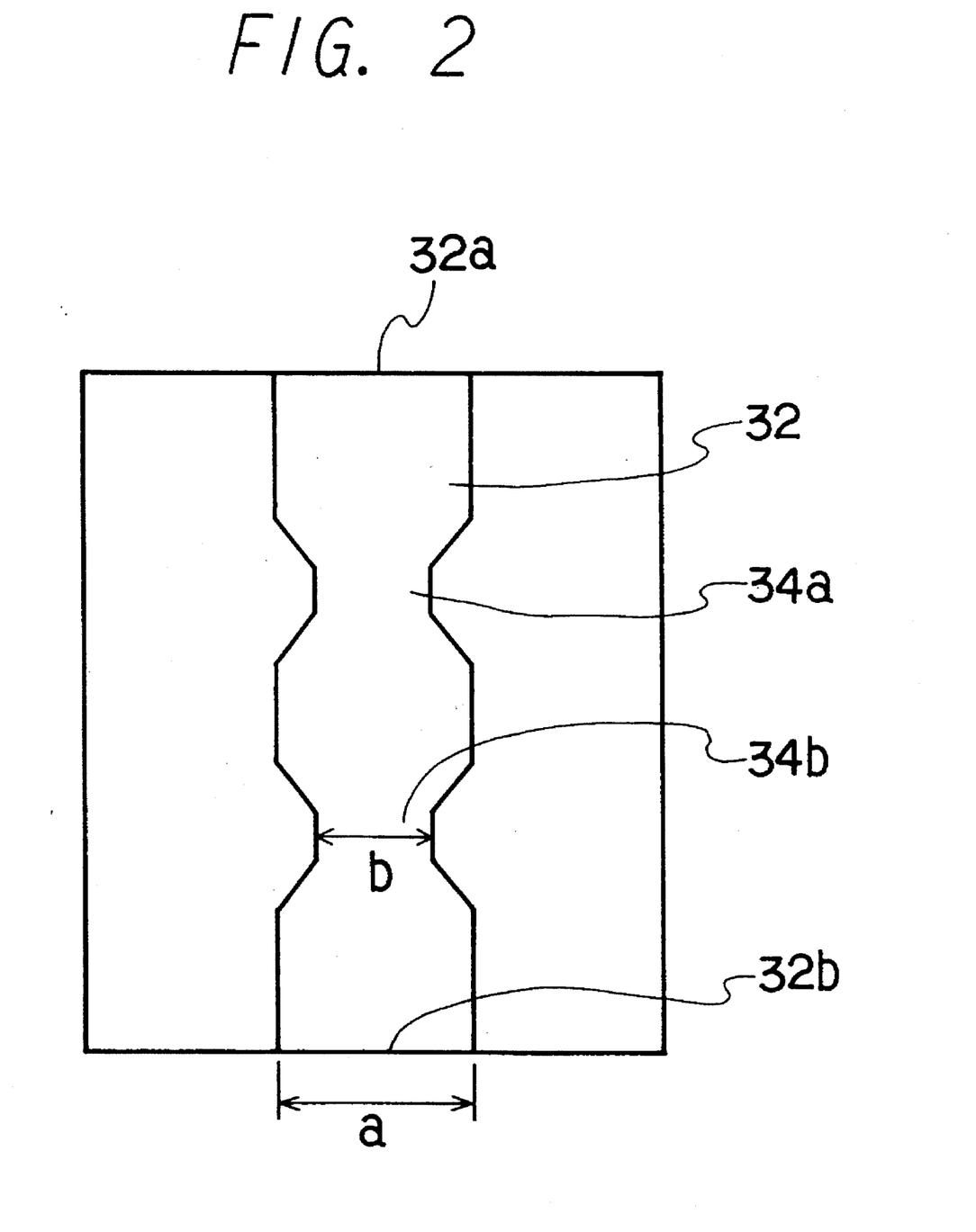
FIG. 2 is a schematic plan view of the semiconductor laser shown in FIG. 1.
Figure 3:
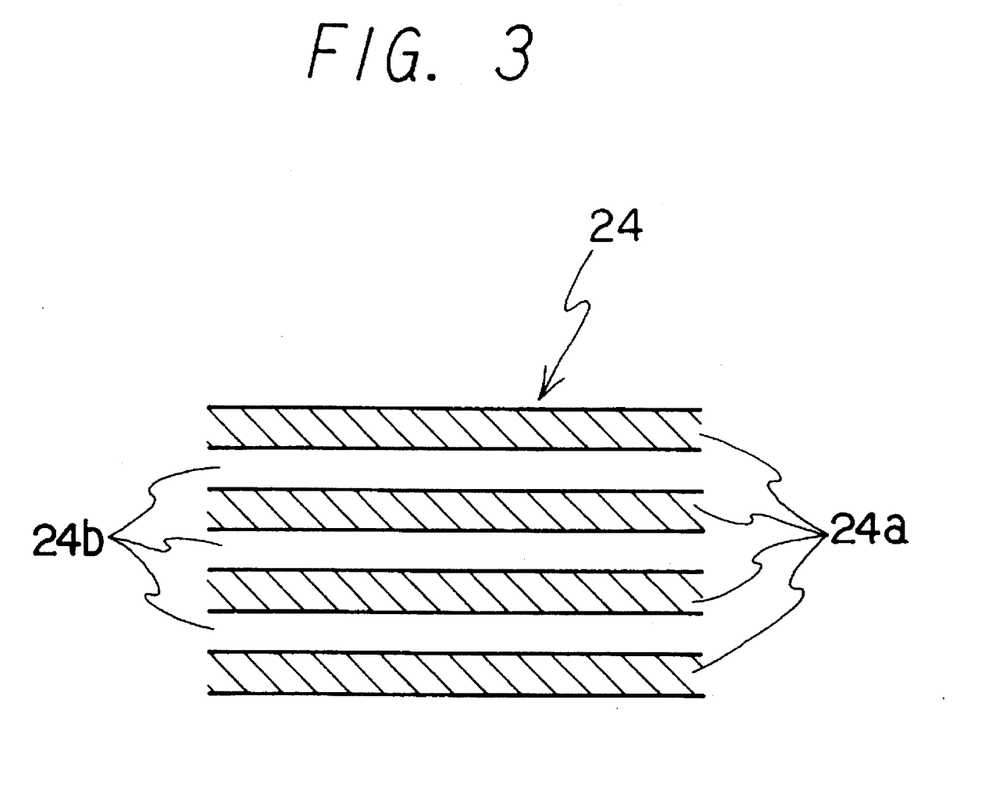
FIG. 3 is an enlarged fragmentary schematic section showing an active layer of a semiconductor laser as an alternative embodiment of the present invention.

FIG. 1 is a schematic sectional view showing a semiconductor laser as one embodiment of the present invention; FIG. 2 is a schematic plan view of the semiconductor laser shown in FIG. 1 for showing the shape of a stripe groove; and FIG. 3 is a detailed view showing an active layer of a semiconductor laser as an alternative embodiment of the present invention, in which active layer are introduced quantum well layers.

Figure 8:
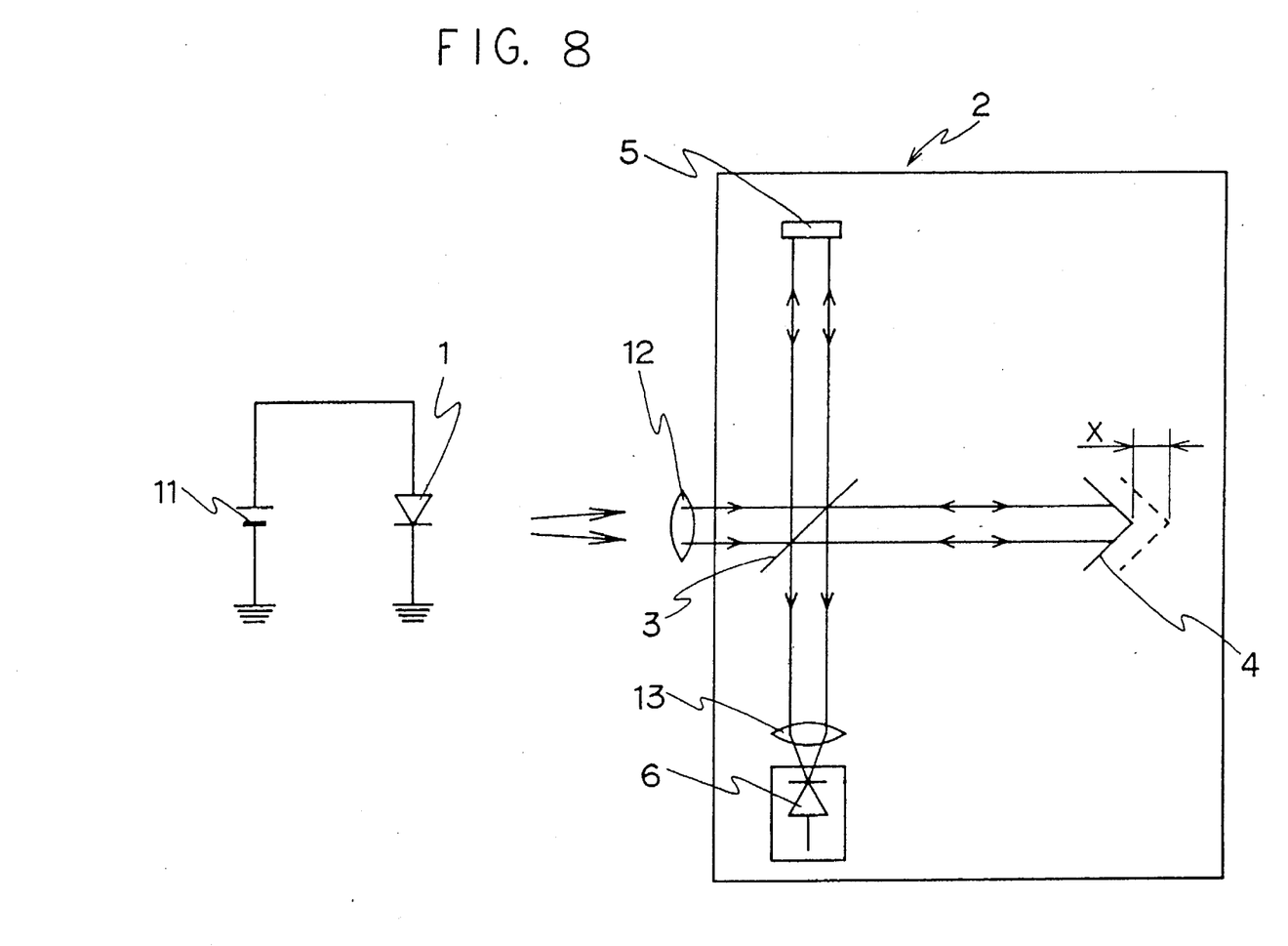
FIG. 8 is a schematic representation of an example of arrangement for use in a method for selecting a semiconductor laser according to the present invention.

In the method of the present invention, first, the intensity of interference fringes of laser light is measured by a conventional interferometer such as Michelson interferometer 2, the laser light being emitted from a semiconductor laser 1 connected to a direct current source 7, as shown in FIG. 8. Specifically, the incoming light emitted from the semiconductor laser 1 is collimated by a lens 8 disposed on the input side of the Michelson intereferometer 2 and then is incident on a half mirror 3 at an angle of incidence of about 45°. At this moment, about a half of the light passes through the half mirror 3 while the rest is reflected by the half mirror in the upward direction in FIG. 8 which makes an angle of about 90° with respect to the incoming light. The light passing through the half mirror 3 is then reflected by a movable mirror 4, returned to the half mirror 3, and reflected thereat in the downward direction in FIG. 8 which makes an angle of about 90° with respect to the incoming light. The light in the downward direction is condensed by a condenser lens (or converging lens) 9 and then input to a photodetector 6 formed of a photodiode or the like.

The light reflected by the half mirror 3 in the upward direction is then reflected by a fixed mirror 5, returned to the half mirror 3, passes therethrough, and input to the photodetector 6 like the counterpart light described above. If the distance twice as large as the distance between the half mirror 3 and the movable mirror 4 is different from that twice as large as the distance between the half mirror 3 and the fixed mirror 4, or in other words there is an optical difference ΔL, interference occurs between the light rays running along the two different paths. The intensity of this interference varies high and low repeatedly with varying moved distance (or displacement) x of the movable mirror 4, and the envelope of the interference is as drawn in FIG. 7. From the intensity of the interference is found the damping ratio of visibility γ. As described above, the daming ratio γ is represented as γ=Ib/Ia, where Ia is the intensity of interference when the optical difference is 0 and Ib is the intensity thereof at one selected of the succeeding peaks. The damping ratio γ can easily be found from the output of the photodetector 6 by the use of a commercially-available spectrum analyzer such as made by ADVANTEST CO.

Figure 9:
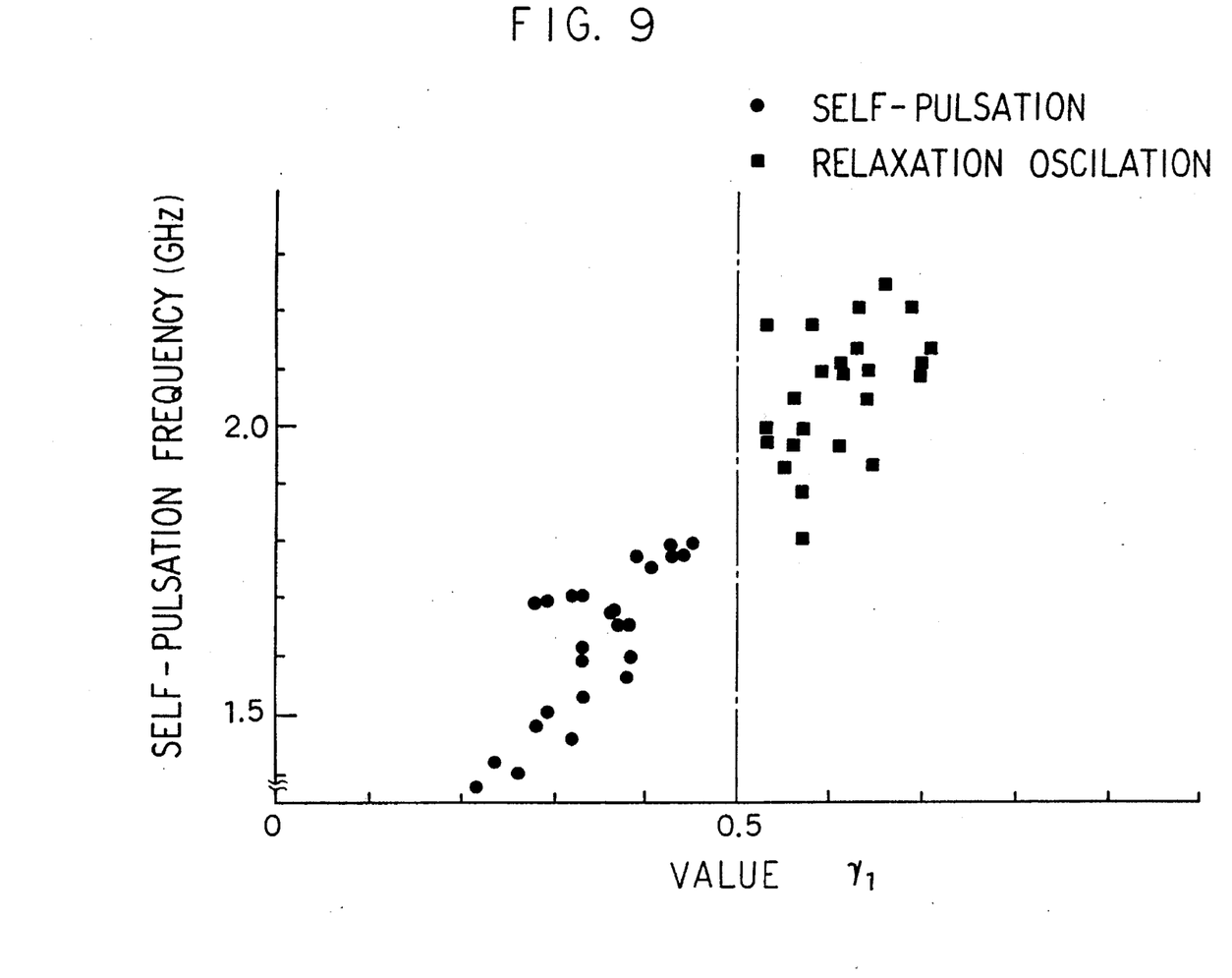
FIG. 9 is diagram showing the relation between self-pulsation and non-self-pulsation relative to varying damping ratio of visibility.

In turn, the fifty pieces of samples thus measured for the damping ratio γ and self-pulsation frequency is examined for the relation between self-pulsation and visibility and relation between non-self-pulsation and visibility in a conventional manner with an oscilloscope. The results of the examination are as shown in FIG. 9. As is apparent from FIG. 9, the semiconductor laser having a damping ratio γ of 0.5 or less generates self-pulsation. Therefore, the measurement on the damping ratio γ of a semiconductor laser allows one to judge whether or not the laser will generate self-pulsation.

Reference is then made to the structure of a semiconductor laser chip shown in FIG. 1 which is likely to generate self-pulsation and can be manufactured with ease.

The semiconductor laser chip includes on a substrate 28 of n-type GaAs a stacked structure comprising a lower cladding layer 26 made of n-type $Al_xGa_{1-x}As$ (Al content: x=0.55), active layer 24 made of $Al_xGa_{1-x}As$ (x=0.12), first upper cladding layer 22 made of p-type $Al_xGa_{1-x}As$ (x=0.55), protective layer 20 made of p-type GaAs which is made to have a band gap equivalent to or larger than that of the active layer 24, AlGaAs layer 18 made of n-type $Al_xGa_{1-x}As$ (x=0.55), current-blocking layer 16 made of n-type GaAs, second upper cladding layer 14 made of p-type $Al_xGa_{1-x}As$ (x=0.55), and cap layer 12 made of $p^+$-type GaAs. The AlGaAs layer 18 and current-blocking layer 16 are digged in the middle portion thereof to form a stripe groove 32. Accordingly the second upper cladding layer 14 is directly stacked on the protective layer 20 in that stripe groove 32. Note that there are provided a n-electrode 30 on the bottom surface of the substrate 28 and a p-electrode 10 on the cap layer 12.

As shown in FIG. 2, the semiconductor laser according to the present embodiment is characterized by providing the stripe groove 32 having a plurality of narrow portions 34a and 34b in the longitudinal direction thereof, on the contrary conventional semiconductor laser has such a construction as to have a stripe of uniform width. These narrow portions 34a and 34b are disposed not on both ends but midway of the length of the stripe groove 32.

Although the cladding layer and the active layer are composed of $Al_xGa_{1-x}As$ with the Al content set to 0.55 and 0.12, respectively in the above embodiment, the Al content is not limited to these values. The Al content for the cladding layer can be selected from the range of 0.45 to 0.7, and for the active layer from the range of 0 to 0.15. In addition, such layers can be formed from other semiconductor materials such as InGaAsP, AlGaInP as well as AlGaAs. Further, the conductivity-type of each of the above components, i.e., p- or n-type can be reversed.

Figure 6:
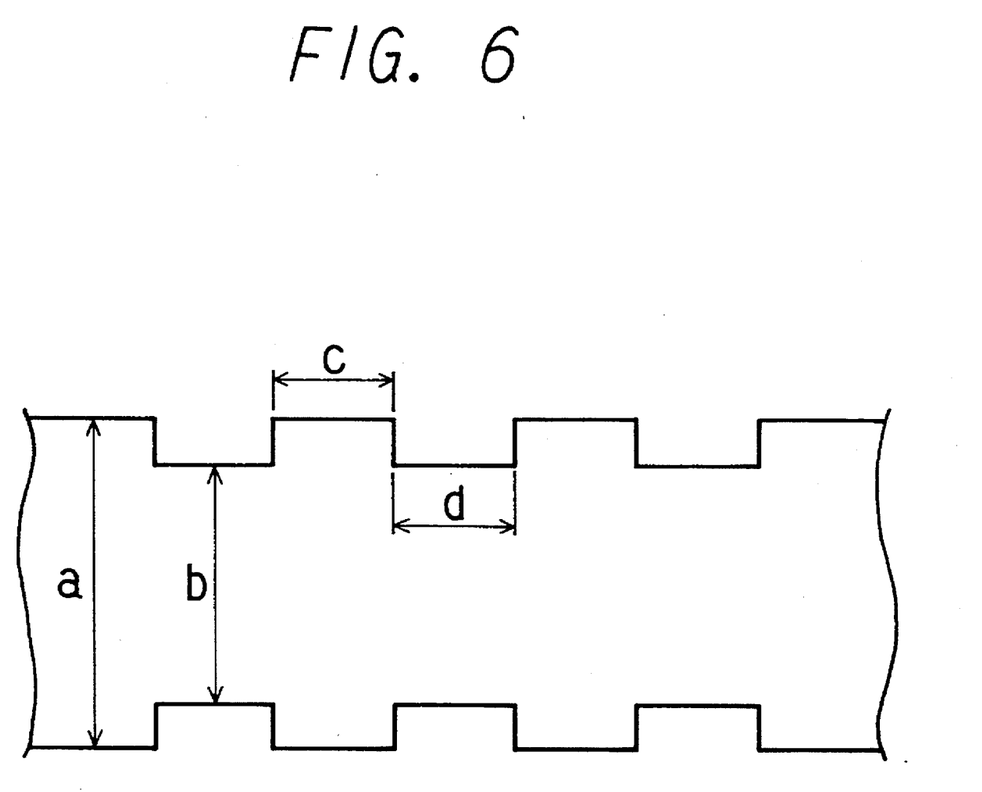
FIG. 6 is a representation showing an example of the shape of an stripe according to the present invention.

Further, in the above embodiment the stripe groove is formed in the current-blocking layer so as to form an active region of striped structure. However, the striped structure according to the present invention can also be obtained by forming not a stripe groove but a stripe-shaped electrode or other means. In this case, the same effects as with the above embodiment can be taken if the stripe-shaped component has narrow and wide portions. Although the narrow and wide portions are joined with each other with intermediation of a joining portion of tapered shape as shown in FIG. 2, the narrow and wide portions can be directly joined with each other without intermediation of such a tapered joining portion, to form a rectangular stripe as shown in FIG. 6.

If the striped structure according to the present invention is applied to a semiconductor laser of which active layer has a quantum well structure, good quantum wells can be formed without precisely controlling the width and number of wells by virtue of the presence of a stripe having narrow and wide portions. The active layer in this case comprises alternate lamination of a barrier layer 24a of $Al_yGa_{1-y}As$ (Al content or Y is, for example, 0.22 and usually $0.15 \leq Y \leq 0.45$) and a quantum well layer 24b made of GaAs. The thickness of each of these layers is, for example, 40 to 100Å. The number of layer 24a and layer 24b might be one respectively, but usually from 3 to 6. By virtue of such a quantum well structure, allows the differential mode gain of laser oscillation can be increased and high-frequency self-pulsation can be generated by virtue of synergic effect of the striped structure and quantum well structure.

To be briefly described next is a method for manufacturing a semiconductor laser chip of the structure shown in FIG. 1. Firstly, the layers of from lower cladding layer 26 to current-blocking layer 16 on the substrate 28 with a Molecular Beam Epitaxy (MBE) system are formed. These layers are herein generally termed "first grown layer". Next, the stripe groove 32 is formed by etching the first grown layer from the surface thereof until the surface of the protective layer 20 is exposed. In this case, if a resist film for this etching is made to have an opening shaped into, for example, a stripe having two narrow portions which corresponds to the stripe shape having the narrow portions 34a and 34b shown in FIG. 2, the stripe groove 32 according to the above embodiment can be formed.

Thus obtained substrate in which the stripe groove 32 has been digged is placed in the MBE system again. In the MBE system, first, the surface of the substrate is irradiated with arsenic molecular beams while being heated so as to remove contaminants that have adhered thereto in the etching step (thermal cleaning process). Next the second upper cladding layer 14 and cap layer 12 are stacked on the substrate thus treated by a second MBE process. Finally, after formation of the upper and lower electrodes 10 and 30, the desired substrate is cut into chips. Note that this manufacturing method is described in detail in Japanese Unexamined Patent Publication No. 163688/1986.

Figure 4:
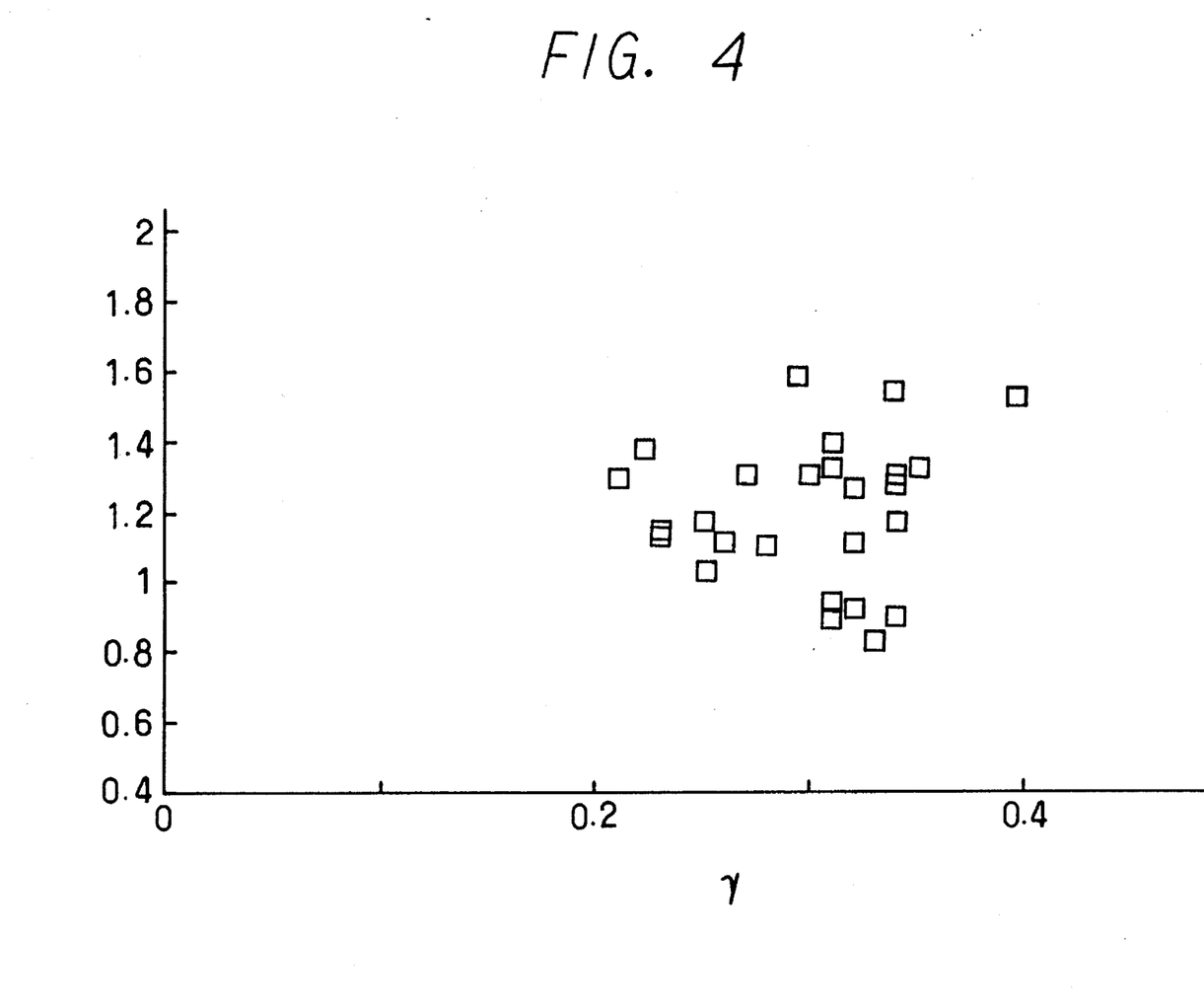
FIG. 4 is a graphical view showing the relationship between value γ and self-pulsation frequency in a semiconductor laser as one embodiment of the present invention.
Figure 5:
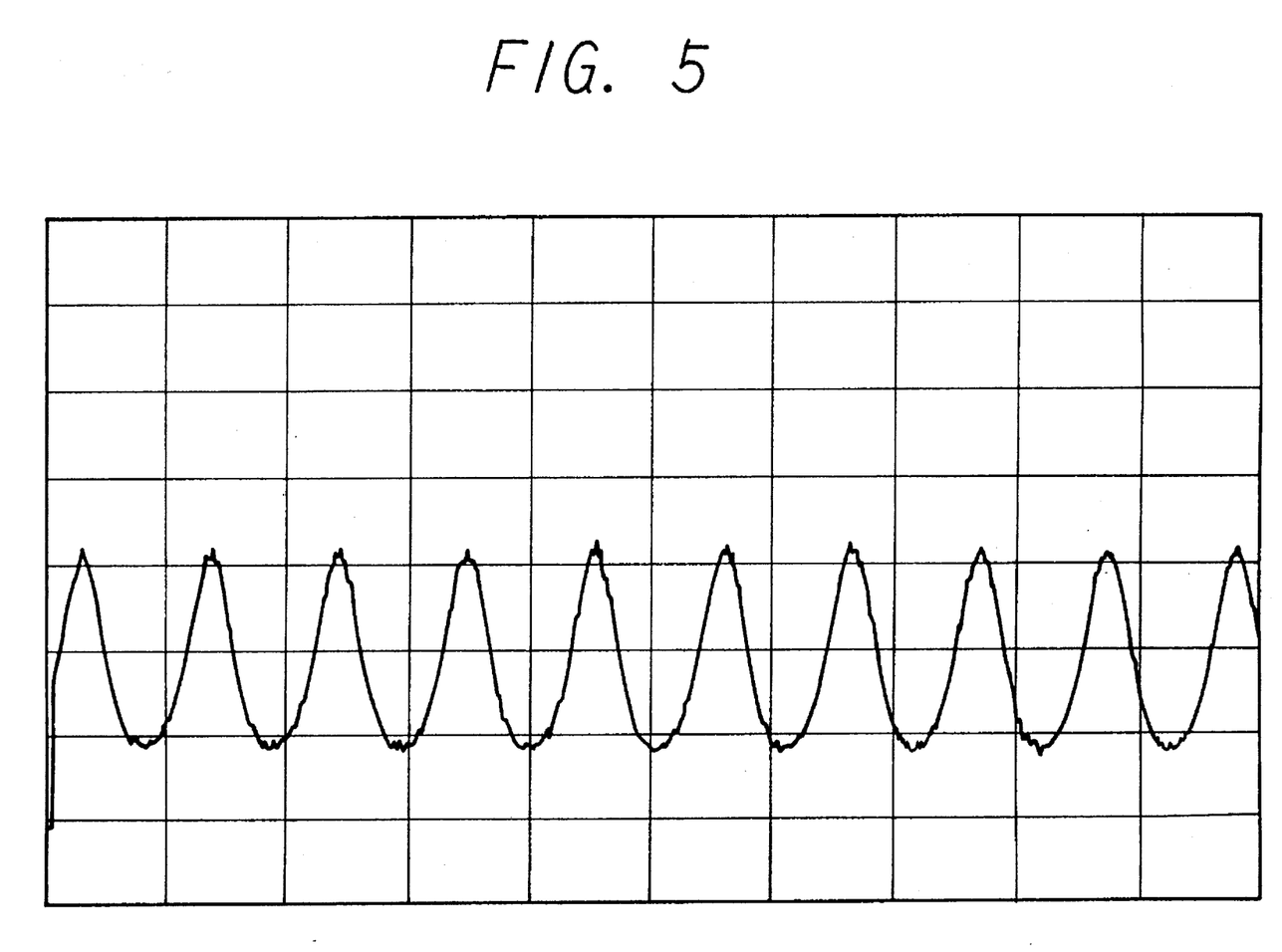
FIG. 5 is a graphical view of self-pulsation generated by a semiconductor laser as one embodiment of the present invention.

With respect to the semiconductor laser thus obtained, FIG. 4 represents the relationship between value γ and self-pulsation frequency when the ratio of two different widths (a and b) of the stripe was b/a= 0.75. On the other hand, FIG. 5 graphically depicts self-pulsation generated by such a semiconductor laser. As can be understood from FIG. 5, good self-pulsation was generated.

Check was conducted on whether a semiconductor laser of the striped structure having three narrow portions 34b as shown in FIG. 6 with the ratio of b to a variously varied. The results are shown in Table 1. Note that in this check the ratio of the length c of a wide portion to the length d of a narrow portion was c:d=1:1.

TABLE 1

| b/a | SELF-PULSATION |
| --- | --- |
| 0.93 | X |
| 0.90 | X |
| 0.88 | X |
| 0.87 | O |
| 0.84 | O |
| 0.81 | O |

Note: Symbols O and X indicate, respectively, ocurrence and no ocuurence of self-pulsation.

Further, the ratio of the length d of a narrow portin to the length c of a wide portion, d/c was variously examined. As a result, the range d/c=0.7 to 1.3 was found to be preferred. When the ratio was larger than 1.3, self-pulsation was hard to occur, while in constrast when it was smaller than 0.7, temperature characteristics of the device were degraded though self-pulsation was easy to occur.

Although the number of narrow portions of a stripe is not particularly limited in the present invention, only one narrow portion will not allow easy self-pulsation, while six or more narrow portions will undesirably cause operation current to increase sharply though easy self-pulsation is likely.

As has been described, according to the present invention the following effects are taken:

(1) A semiconductor laser exhibiting self-pulsation can easily be selected by merely measuring the damping ratio of visibility of interference fringes of its laser radiation using a commercially-available interferometer such as a spectrum analyzer or a wavemeter. Further, the selection is made assuredly and objectively and can be conducted in an automated manner. This results in an inexpensive, highly-reliable semiconductor laser for optical communications.

(2) By providing a stripe having narrow portions and wide portions in a semiconductor laser, (a) a highly reliable self-pulsation type semiconductor laser is likely to be obtained of which the life will never be shortened due to heat absorption or the like; and (b) a self-pulsation type semiconductor laser is likely to be obtained with excellent productivity which does not need complicated or increased production steps or precisely controlled fabrication.

The semiconductor laser taking these effects according to the present invention can be widely utilized in the fields of optical recording, optical communications and the like.

Though several embodiments of the present invention are described above, it is to be understood that the present invention is not limited only to the above-mentioned and various changes and modifications may be made in the invention without departing from the spirit and scope thereof.

What is claimed is:

1. A method for selecting a semiconductor laser, comprising the steps of:

(a) measuring highest peak intensity, $I_a$, and next highest peak intensity, $I_b$, of an interference fringes pattern of laser radiation of each semiconductor laser using an interferometer to find a damping ratio of visibility of the interference fringes pattern, $\gamma = I_b/I_a$; and (b) selecting a semiconductor laser exhibiting self-pulsation by selecting a semiconductor laser which emits laser radiation whose damping ratio of visibility, $\gamma$, is 0.5 or less.

2. The method of claim 1, wherein said damping ratio of visibility, $\gamma$, is found using Michelson interferometer.

3. The method of claim 1, wherein said semiconductor laser comprises an active layer having an active region of a striped structure, and cladding layers sandwiching the active layer, the active region being formed with a stripe having at least two different widths.

4. The method of claim 3, wherein said active layer comprises at least one quantum well layer.

5. The method of claim 3, wherein a ratio of the smallest width of the stripe to the largest width thereof satisfies the formula:

$$b/a < 0.87$$

where a represents the largest width of the stripe, and b represents the smallest width thereof.

6. The method of claim 3, wherein a ratio of the length of a narrowest portion of the stripe to the length of a widest portion thereof satisfies the formula:

$$0.7 \leq d/c \leq 1.3$$

where c represents the length of the widest portion of the stripe, and d represents the length of the narrowest portion thereof.

* * * * *